United States Patent
Metz et al.

(10) Patent No.: US 7,087,476 B2
(45) Date of Patent: Aug. 8, 2006

(54) USING DIFFERENT GATE DIELECTRICS WITH NMOS AND PMOS TRANSISTORS OF A COMPLEMENTARY METAL OXIDE SEMICONDUCTOR INTEGRATED CIRCUIT

(75) Inventors: Matthew V. Metz, Hillsboro, OR (US); Suman Datta, Beaverton, OR (US); Jack Kavalieros, Portland, OR (US); Mark L. Doczy, Beaverton, OR (US); Justin K. Brask, Portland, OR (US); Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/900,585

(22) Filed: Jul. 28, 2004

(65) Prior Publication Data
US 2006/0022271 A1   Feb. 2, 2006

(51) Int. Cl.
   H01L 21/8238 (2006.01)
(52) U.S. Cl. .................. 438/199; 257/369
(58) Field of Classification Search .......... 257/369, 257/296, 327, 368; 438/199, 288, 283
See application file for complete search history.

(56) References Cited

U.S. PATENT DOCUMENTS

| | | | |
|---|---|---|---|
| 5,672,521 A * | 9/1997 | Barsan et al. ............... 438/276 |
| 5,763,922 A * | 6/1998 | Chau ............................ 257/371 |
| 6,133,164 A * | 10/2000 | Kim ............................. 438/275 |
| 6,333,223 B1 | 12/2001 | Moriwaki et al. |
| 6,335,262 B1 * | 1/2002 | Crowder et al. ............ 438/440 |
| 6,432,776 B1 | 8/2002 | Ono |
| 6,538,278 B1 * | 3/2003 | Chau ............................ 257/324 |
| 6,670,248 B1 | 12/2003 | Ang et al. |
| 6,670,990 B1 * | 12/2003 | Kochi et al. ................. 348/310 |
| 2001/0027005 A1 | 10/2001 | Moriwaki et al. |
| 2004/0082125 A1 * | 4/2004 | Hou et al. .................. 438/240 |
| 2004/0102009 A1 * | 5/2004 | Quevedo-Lopez et al. .. 438/287 |
| 2004/0198009 A1 * | 10/2004 | Chen et al. ................. 438/303 |
| 2004/0224450 A1 * | 11/2004 | Itonaga et al. .............. 438/197 |
| 2004/0227196 A1 * | 11/2004 | Yoneda ....................... 257/410 |
| 2005/0056899 A1 * | 3/2005 | Rendon et al. ............. 257/408 |

OTHER PUBLICATIONS

Metz e al., "Using Different Gate Dielectrics with NMOS and PMOS Transistors of a Complementary Metal Oxide Semiconductor Integrated Circuit", U.S. Appl. No. 10/881,055, Jun. 30, 2004.

* cited by examiner

Primary Examiner—Douglas W Owens
(74) Attorney, Agent, or Firm—Trop, Pruner & Hu, P.C.

(57) ABSTRACT

Complementary metal oxide semiconductor integrated circuits may be formed with NMOS and PMOS transistors having different gate dielectrics. The different gate dielectrics may be formed, for example, by a subtractive process. The gate dielectrics may differ in material, thickness, or formation techniques, as a few examples.

20 Claims, 4 Drawing Sheets

USING DIFFERENT GATE DIELECTRICS WITH NMOS AND PMOS TRANSISTORS OF A COMPLEMENTARY METAL OXIDE SEMICONDUCTOR INTEGRATED CIRCUIT

BACKGROUND

This invention relates generally to semiconductor technology, semiconductor processing, and the formation of complementary metal oxide semiconductor integrated circuits.

Complementary metal oxide semiconductor (CMOS) integrated circuits include NMOS transistors and PMOS transistors. Generally, these transistors may be made by forming a gate dielectric and then forming NMOS and PMOS gate structures on top of that dielectric. The gate electrode structures may be made of polysilicon, silicide, or metal.

MOS field-effect transistors with very thin gate dielectrics made from silicon dioxide may experience unacceptable gate leakage currents. Forming the gate dielectric from certain high-k dielectric materials, instead of silicon dioxide, can reduce gate leakage. Because, however, such a dielectric may not be compatible with polysilicon, it may be desirable to use metal gate electrodes in devices that include high-k gate dielectrics.

When making a CMOS device that includes metal gate electrodes, a replacement gate process may be used to form gate electrodes from different metals. In that process, a first polysilicon layer, bracketed by a pair of spacers, is removed to create a trench between the spacers. The trench is filled with a first metal. A second polysilicon layer is then removed, and replaced with a second metal that differs from the first metal. Because this process requires multiple etch, deposition, and polish steps, high volume manufacturers of semiconductor devices may be reluctant to use it.

Rather that apply a replacement gate process to form a metal gate electrode on a high-k gate dielectric layer, a subtractive approach may be used. In such a process, a metal gate electrode is formed on a high-k gate dielectric layer by depositing a metal layer on the dielectric layer, masking the metal layer, and then removing the uncovered part of the metal layer and the underlying portion of the dielectric layer. Unfortunately, the exposed sidewalls of the resulting high-k gate dielectric layer render that layer susceptible to lateral oxidation, which may adversely affect its physical and electrical properties.

Thus, there is a need for complementary metal oxide semiconductor fabrication techniques.

DETAILED DESCRIPTION

Complementary metal oxide semiconductor (CMOS) integrated circuits may be fabricated with NMOS and PMOS transistors having different gate dielectrics. The dielectrics may be different in terms of the materials used, their thicknesses, or the techniques used to form the gate dielectrics, to mention a few examples. As a result, the gate dielectric can be tailored to the particular type of transistor, be it an NMOS or PMOS transistor, as the case may be.

Figure 1:
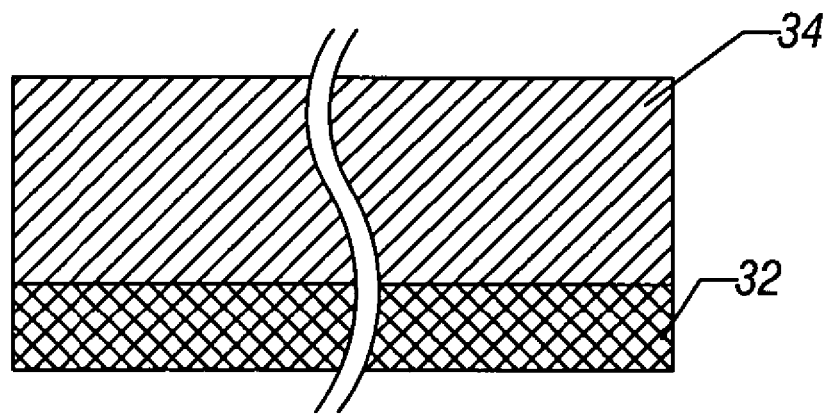
FIG. 1 is a partial, enlarged, cross-sectional view of another embodiment of the present invention at an early stage of manufacture in accordance with one embodiment of the present invention.
Figure 2:
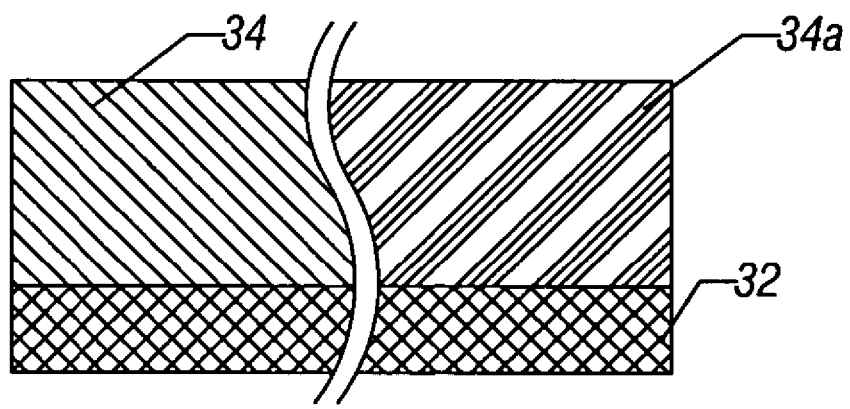
FIG. 2 is a partial, enlarged, cross-sectional view of the embodiment shown in FIG. 1 at a subsequent stage of manufacture in accordance with one embodiment of the present invention.

Referring to FIG. 1, initially, a substrate 32 may be covered by a masking material 34 such as resist. Then, as shown in FIG. 2, the masking material 34 may be exposed to create an exposed region 34a on the right and an unexposed region 34 on the left. In many cases, the regions 34 and 34a may be widely spaced over the semiconductor structure 32 and may correspond to active areas where NMOS versus PMOS transistors will ultimately be formed.

Figure 3:
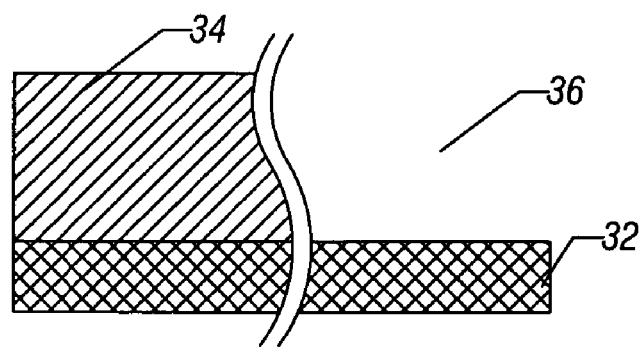
FIG. 3 is a partial, enlarged, cross-sectional view of the embodiment shown in FIG. 2 at a subsequent stage of manufacture in accordance with one embodiment of the present invention.

Referring to FIG. 3, the exposed wafer, shown in FIG. 2, may then be patterned to remove the exposed material 34a. Alternatively, unexposed material may be selectively removed. Then, as shown in FIG. 3, an opening 36 may be created.

Figure 4:
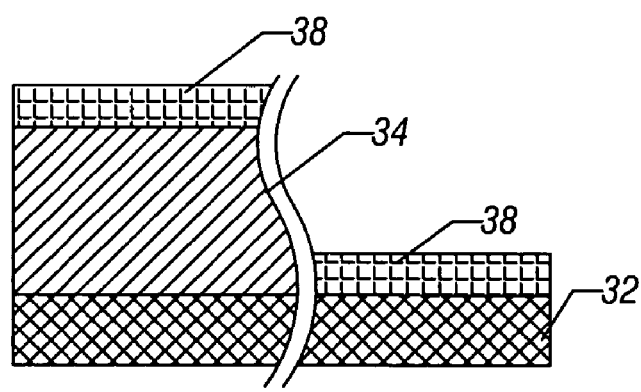
FIG. 4 is a partial, enlarged, cross-sectional view of the embodiment shown in FIG. 3 at a subsequent stage of manufacture in accordance with one embodiment of the present invention.

In FIG. 4, a gate dielectric 38 may then be deposited or grown over the resulting structure. The gate dielectric 38 is formed on top of the substrate 32 and also on top of the masking layer 34.

Figure 5:
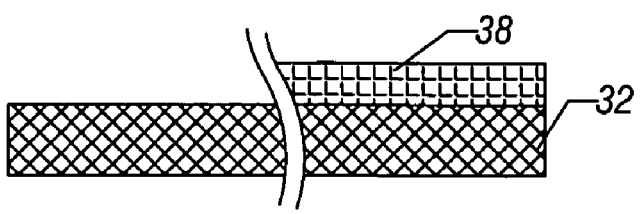
FIG. 5 is a partial, enlarged, cross-sectional view of the embodiment shown in FIG. 4 at a subsequent stage of manufacture in accordance with one embodiment of the present invention.

When the masking layer 34 is removed, as indicated in FIG. 5, the overlying portion of the gate dielectric 38 is also lifted off. Thus, the gate dielectric 38 is left only where it is directly deposited on the substrate 32 in one embodiment of the present invention.

Figure 6:
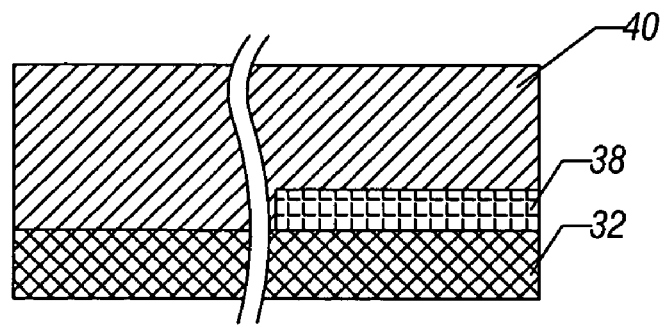
FIG. 6 is a partial, enlarged, cross-sectional view of the embodiment shown in FIG. 5 at a subsequent stage of manufacture in accordance with one embodiment of the present invention.
Figure 7:
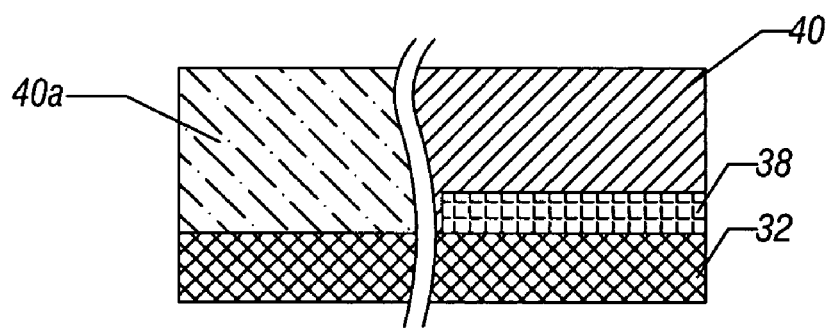
FIG. 7 is a partial, enlarged, cross-sectional view of the embodiment shown in FIG. 6 at a subsequent stage of manufacture in accordance with one embodiment of the present invention.
Figure 8:
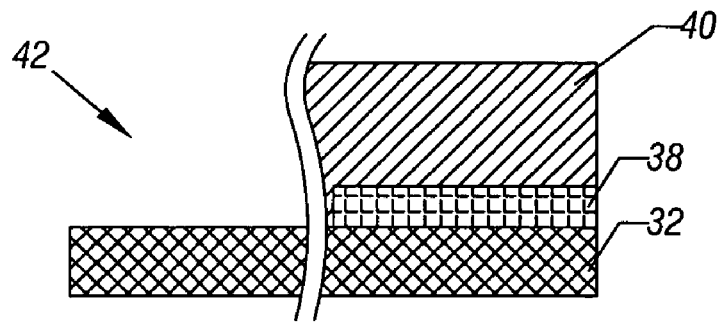
FIG. 8 is a partial, enlarged, cross-sectional view of the embodiment shown in FIG. 7 at a subsequent stage of manufacture in accordance with one embodiment of the present invention.

Referring to FIG. 6, the wafer may be covered with another masking layer 40 which, again, may be resist in one embodiment of the present invention. Then, as shown in FIG. 7, the masking layer 40 may be differentially exposed. In the embodiment illustrated, the layer 40a has been modified by exposure so that, as shown in FIG. 8 on the left, it may be selectively removed to create a gap 42.

Figure 9:
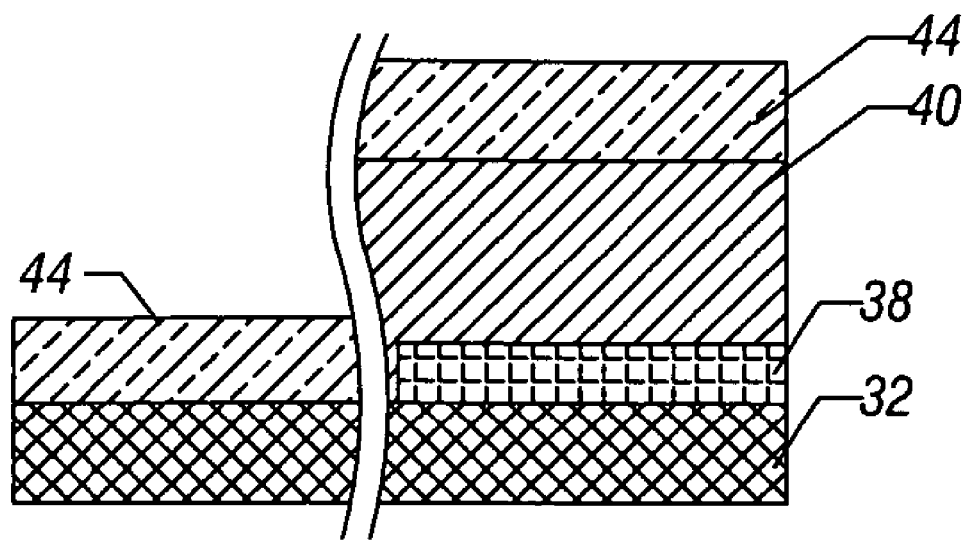
FIG. 9 is a partial, enlarged, cross-sectional view of the embodiment shown in FIG. 8 at a subsequent stage of manufacture in accordance with one embodiment of the present invention after subsequent processing.

Then, as shown in FIG. 9, a gate dielectric 44 may be deposited or grown over the substrate 32. The layer 44 accumulates on the substrate 32 on the left and over the masking layer 40 on the right.

Figure 10:
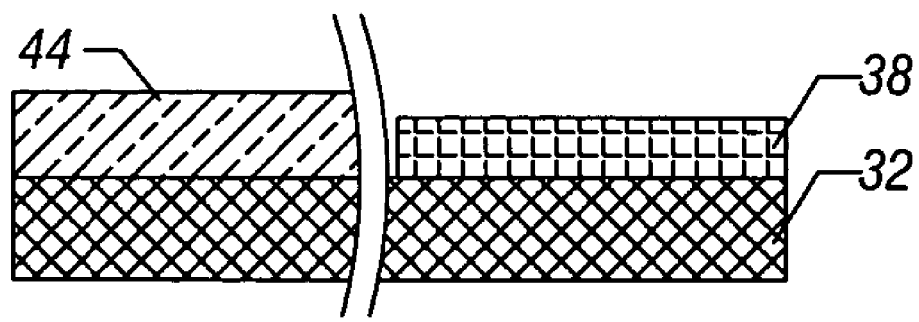
FIG. 10 is a partial, enlarged, cross-sectional view of the embodiment shown in FIG. 9 at a subsequent stage of manufacture in accordance with one embodiment of the present invention.

Finally, in FIG. 10, the dielectric 44 over the masking layer 40 may be lifted off, leaving the dielectric layer 44 only over the substrate 32. As a result, different dielectric materials 44 and 38 are formed in different regions to act as the gate dielectrics for NMOS versus PMOS transistors or for transistors of the same type used for different applications. Thereafter, the PMOS and NMOS transistors may be built up using an appropriate fabrication technology. For example, gate electrodes may be formed of polysilicon, silicide, metal, or any other appropriate material.

In one embodiment, the dielectric 38 can be selected to have characteristics to optimize the performance of either an NMOS or PMOS transistor to be formed in the region 36. For example, the gate dielectric 38 material, thickness or formation technique may be tailored for its particular application.

For example, the NMOS transistor may use a larger conduction band offset material, such as silicon dioxide, and the PMOS transistor may use a material with a higher dielectric constant, such as hafnium dioxide, which also happens to have good band offset for holes. Higher dielectric constants may be greater than ten in one embodiment. As another example, a thicker material may be utilized for the NMOS than the PMOS transistors in some cases. For example, hafnium dioxide leaks electrons more than holes, so a thicker hafnium dioxide layer may be utilized on the NMOS transistors and a thinner hafnium dioxide layer may be utilized on the PMOS transistors. For example, in one embodiment, the hafnium dioxide gate dielectric may be 30 Angstroms for the NMOS transistors and 15 Angstroms for the gate dielectric for PMOS transistors.

As still another example, the deposition techniques may be different for the two gate dielectrics. For example, materials for the NMOS transistor, such as silicon dioxide, may be deposited using diffusion techniques, while atomic layer deposition, sputtering, or metal organic chemical vapor deposition (MOCVD) may be utilized to deposit high dielectric constant materials such as hafnium dioxide.

In some embodiments, a single gate dielectric material may not provide the highest performance for both NMOS and PMOS structures. This may be due, for example, to poor band offset with conduction or valence bonds, incompatibility to the gate electrode material, incompatibility with gate electrode processing or thickness requirements. By selecting the better candidate dielectric film for each structure, and depositing the best film with the optimal thickness, higher performance complementary metal oxide semiconductor devices may be created in some embodiments. By using better gate dielectric material of optimal thickness for each electrode stack, higher performance structures may be created that may exhibit higher mobility, higher saturation current, or better threshold voltage in some embodiments.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
    defining NMOS and PMOS transistor areas on a substrate
    forming a mask over one of the NMOS or PMOS areas;
    forming a first gate dielectric on the substrate and over the mask to form a transistor of a first conductivity type;
    masking said first gate dielectric; and
    forming a second gate dielectric to form a transistor of a second conductivity type.

2. The method of claim 1 including forming said first and second gate dielectrics of different thicknesses.

3. The method of claim 1 including forming said first and second gate dielectrics of different materials.

4. The method of claim 1 including forming first and second gate dielectrics deposited by different techniques.

5. The method of claim 1 including lifting off the dielectric formed over the mask.

6. The method of claim 1 including forming NMOS and PMOS transistors with metal gates.

7. The method of claim 1 including using material with a larger conduction band offset for an NMOS gate dielectric.

8. The method of claim 1 including using a material with a higher dielectric constant as the gate dielectric for a PMOS transistor.

9. The method of claim 1 including using a thicker dielectric for said NMOS transistor than for said PMOS transistor.

10. The method of claim 9 including using first and second dielectrics having dielectric constants greater than 10.

11. A semiconductor structure comprising:
    a substrate;
    NMOS and PMOS transistor areas on said substrate;
    a mask over only one of said areas; and
    a gate dielectric over said mask and both of said areas.

12. The structure of claim 11 wherein said gate dielectric has a dielectric constant greater than 10.

13. The structure of claim 11 wherein said mask is resist.

14. The structure of claim 11 wherein said gate dielectric is a metal oxide.

15. A method comprising:
    forming an NMOS transistor of a complementary metal oxide semiconductor integrated circuit in an NMOS region and a PMOS transistor in a PMOS region by masking a PMOS region and forming a first gate dielectric on both PMOS and NMOS regions; and
    forming a PMOS transistor of said complementary metal oxide semiconductor integrated circuit with a second gate dielectric different than said first gate dielectric.

16. The method of claim 15 including forming said dielectrics having different dielectric thicknesses.

17. The method of claim 15 including forming said dielectrics of different materials.

18. The method of claim 15 including depositing said dielectrics using different deposition techniques.

19. The method of claim 15 including using material with a larger conduction band offset for the first gate dielectric.

20. The method of claim 15 including using a material with a higher dielectric constant as said second gate dielectric.

* * * * *